(12) United States Patent
McLeod et al.

(10) Patent No.: US 8,401,045 B2
(45) Date of Patent: Mar. 19, 2013

(54) REGULATING A VERTICAL-CAVITY SURFACE-EMITTING LASER (VCSEL)-BASED OPTICAL COMMUNICATION LINK

(75) Inventors: Scott McLeod, Los Gatos, CA (US); Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/118,322

(22) Filed: May 27, 2011

(65) Prior Publication Data

US 2012/0300801 A1    Nov. 29, 2012

(51) Int. Cl.
*H01S 3/13* (2006.01)

(52) U.S. Cl. .......... 372/29.01; 372/29.011; 372/29.015; 372/29.02; 372/29.021

(58) Field of Classification Search .......... 372/29.01, 372/29.011, 29.015, 29.02
See application file for complete search history.

(56) References Cited

U.S. PATENT DOCUMENTS

| | | | |
|---|---|---|---|
| 5,577,064 A | 11/1996 | Swirhun | |
| 5,625,480 A | 4/1997 | Swirhun | |
| 5,812,582 A | 9/1998 | Gilliland | |
| 6,368,890 B1 | 4/2002 | Wickstrom | |
| 6,539,038 B1 * | 3/2003 | Wilkerson et al. ......... | 372/38.02 |
| 7,949,025 B2 * | 5/2011 | Olea ........................ | 372/38.02 |

OTHER PUBLICATIONS

Analui, Behnam et al., "A Fully Integrated 20-Gb/s Optoelectronic Transceiver Implemented in a Standard 0.13-µm CMOS SOI Technology," *IEEE J. Solid-State Circuits*, vol. 41, No. 12, pp. 2945-2955, Dec. 2006.

\* cited by examiner

*Primary Examiner* — Dung Nguyen
(74) *Attorney, Agent, or Firm* — Baker Botts L.L.P.

(57) ABSTRACT

In one embodiment, a transmitter can bias a vertical-cavity surface-emitting laser (VCSEL) coupled to an optical medium. The biasing of the VCSEL determines at least in part an optical power output by the VCSEL to the optical medium. The transmitter can also modulate the VCSEL with data to transmit the data optically through the optical medium to a receiver; receive from the receiver through a feedback channel an error vector representing a degradation in performance of the VCSEL sensed by the receiver or an instruction vector comprising one or more coefficients for use in biasing the VCSEL; and adjust the biasing of the VCSEL based on the error vector or the instruction vector to regulate the optical power output by the VCSEL to the optical medium.

44 Claims, 5 Drawing Sheets

REGULATING A VERTICAL-CAVITY SURFACE-EMITTING LASER (VCSEL)-BASED OPTICAL COMMUNICATION LINK

TECHNICAL FIELD

This disclosure generally relates to optical communications.

BACKGROUND

Optical signaling is as an alternative to electrical signaling for high-speed short-reach communication links. Vertical-cavity surface-emitting lasers (VCSELs) typically are the light source in short-reach high-speed optical links. The light produced by the VCSEL is coupled to an optical medium (e.g., fiber or waveguide) and sensed at the receiver by, for example, a photodiode (PD).

Aging and temperature dependence are two issues that affect a VCSEL's operation. As the device ages or as the temperature increases, the VCSEL's output degrades from that of its nominal condition, causing a link to generate more bit errors or even to fail in the extreme case. The VCSEL's threshold current $I_{TH}$ increases with temperature and aging, while the slope efficiency η decreases. Both of these changes result in the VCSEL producing less output power for a given bias and modulation current.

DESCRIPTION OF EXAMPLE EMBODIMENTS

Figure 1:
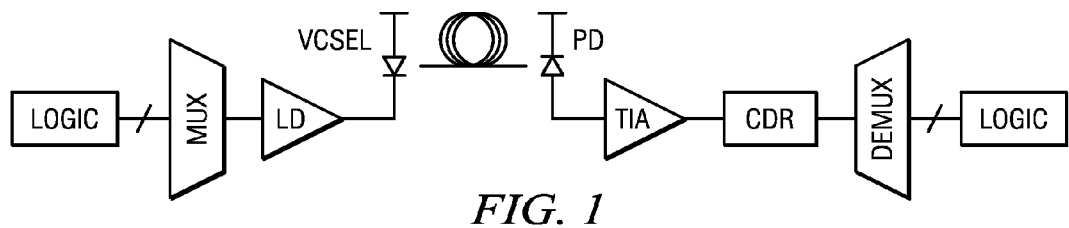
FIG. 1 illustrates an example short-reach optical link.

FIG. 1 illustrates an example short-reach optical link. In particular embodiments, a vertical-cavity surface-emitting laser (VCSELs) may be the light source in a short-reach high-speed optical link. As an example and not by way of limitation, the VCSEL may reside in a transmitter and may be biased and modulated there by a laser-driver (LD) circuit with data that is to be transmitted. In particular embodiments, the light produced by the VCSEL may be coupled to an optical medium (such as, for example, a fiber or a waveguide) and may be sensed at a receiver by, for example, a photodiode (PD). Although this disclosure describes a particular VCSEL in a particular configuration, this disclosure contemplates any suitable VCSEL in any suitable configuration.

Figure 2:
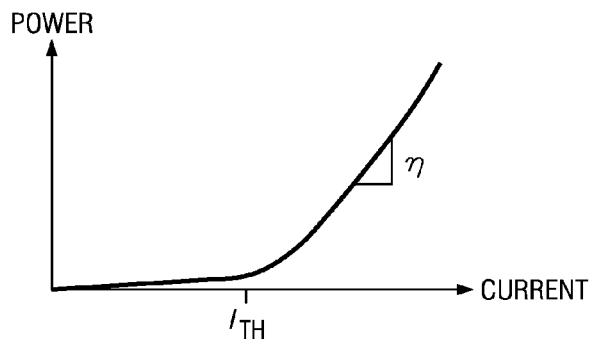
FIG. 2 illustrates example direct current (DC) performance of a VCSEL.

FIG. 2 illustrates example DC performance of a VCSEL. In particular embodiments, a VCSEL's DC performance may be characterized by plotting how much optical power it emits for a given bias current. As an example and not by way of limitation, when the VCSEL is biased above its threshold $I_{TH}$, the VCSEL may generate optical power linearly proportional (with a proportionality constant η) to the bias current. As another example and not by way of limitation, when the VCSEL is biased below $I_{TH}$, the VCSEL may produce negligible output power. The constant η is known as the slope efficiency of the VCSEL and carries units of Watts/Ampere. In particular embodiments, a higher efficiency means that the VCSEL will generate more output power for a given current.

Figure 3:
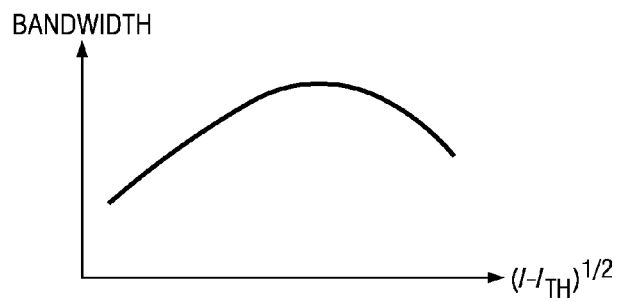
FIG. 3 illustrates example bandwidth of an example VCSEL with respect to bias current.

FIG. 3 illustrates example bandwidth of an example VCSEL with respect to bias current. In particular embodiments, the VCSEL's high-speed performance may depend on how it is biased. As an example and not by way of limitation, the VCSEL's bandwidth scales with the bias current. The bandwidth may be low with small bias currents but may increase linearly with the square root of the bias current above threshold current. As a result, VCSELs in high-speed links may be biased well above their threshold current levels. Although this disclosure describes the VCSEL performing in particular ways, this disclosure contemplates the VCSEL performing in any suitable way.

Figure 4:
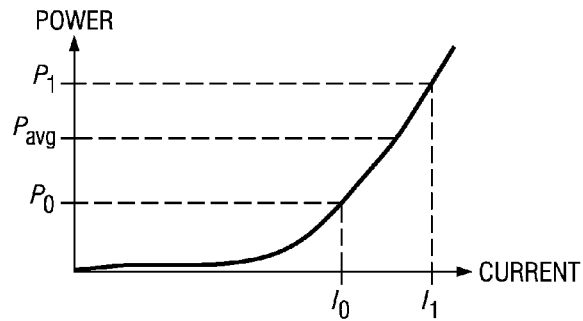
FIG. 4 illustrates example output power of an example VCSEL with respect to modulation current.

FIG. 4 illustrates example output power of an example VCSEL with respect to modulation current. In particular embodiments, the LOW and HIGH logic levels in VCSEL-based communication links may be represented by two positive, non-zero power levels, where the output power for the LOW logic level is $P_0$ and the power level for the HIGH logic level is $P_1$. In particular embodiments, assuming an equal number of LOW and HIGH symbols is transmitted, the average output power level $P_{avg}$ may be midway between $P_0$ and $P_1$.

Figure 5:
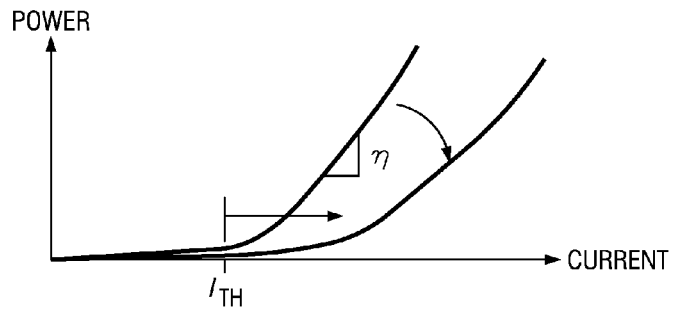
FIG. 5 illustrates example effects of aging and temperature on the performance of an example VCSEL.

FIG. 5 illustrates example effects of aging and temperature on the performance of an example VCSEL. In particular embodiments, aging and temperature dependence are two issues that may affect a VCSEL's operation. As an example and not by way of limitation, as the VCSEL ages or as the temperature increases, the VCSEL's output may degrade from that of its nominal condition, causing a link to generate more bit errors or even to fail in the extreme case. As another example and not by way of limitation, the threshold current $I_{TH}$ may increase with temperature and aging, while the slope efficiency 11 may decrease. In particular embodiments, as a result of age or temperature, the VCSEL may produce less output power (for example, smaller $P_0$, $P_1$ and $P_{avg}$) for a given bias and modulation current. Although this disclosure describes the VCSEL degrading in particular ways due to particular causes, this disclosure contemplates the VCSEL degrading in any suitable way due to any suitable cause.

In particular embodiments, the VCSEL's operation may be regulated so that the link performs at a low bit-error rate (BER) independent of how temperature or aging may affect the VCSEL. As an example and not by way of limitation, the VCSEL may be regulated by sensing changes in the VCSEL's output, in response to temperature changes or aging effects, and by adjusting its operation via feedback. Although this disclosure describes regulating the VCSEL in particular ways, this disclosure contemplates regulating the VCSEL in any suitable way.

Figure 6:
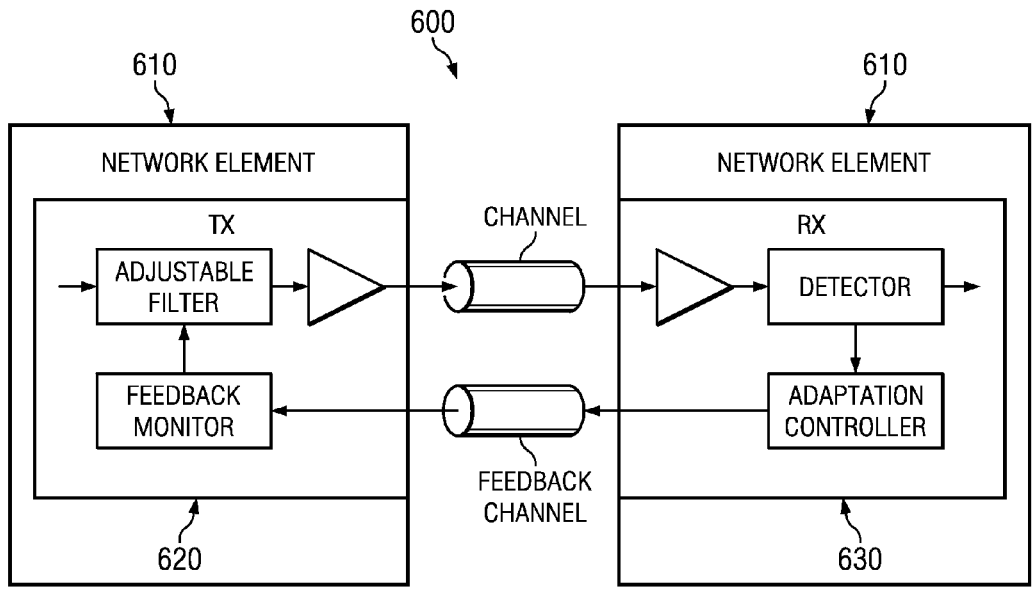
FIG. 6 illustrates an example network system with adaptive feedback control.

FIG. 6 illustrates an example network system with adaptive feedback control. As provided in FIG. 6, network system 600 may include network elements 610 connected by a channel. In particular embodiments, the channel may be an optical channel. As an example and not by way of limitation, the channel may be a fiber or waveguide. Network system 600 may also include a feedback channel. In particular embodiments, the feedback channel may be optical, electrical or logical. In particular embodiments, feedback information may be transmitted across the feedback channel. In some embodiments, the feedback channel may not be separate from the channel.

Network elements 610 may include a transmitter (TX) 620 and a receiver (RX) 630. In particular embodiments, TX 620 may include a feedback monitor and an adjustable filter. In some embodiments, the parameters of the adjustable filter may be controlled by the feedback monitor. In particular embodiments, the adjustable filter may pre-condition the data that is to be transmitted across the channel in order to compensate for any distortion that may affect the quality or reliability of transmission.

RX 630 may include a detector and an adaptation controller. In particular embodiments, the detector may sample a received signal, and the adaptation controller may process the received signal in order to generate adaptation information that may be communicated back to TX 620. As an example and not by way of limitation, the adaptation information may be communicated back to TX 620 across the feedback channel. In particular embodiments, the adaptation controller may process the received signal at a speed slower than that of the received signal's transmission across the channel. The slower processing speed may reduce the impact of the processing on network system's 600 operation, which may allow the channel speed to be increased.

Figure 7:
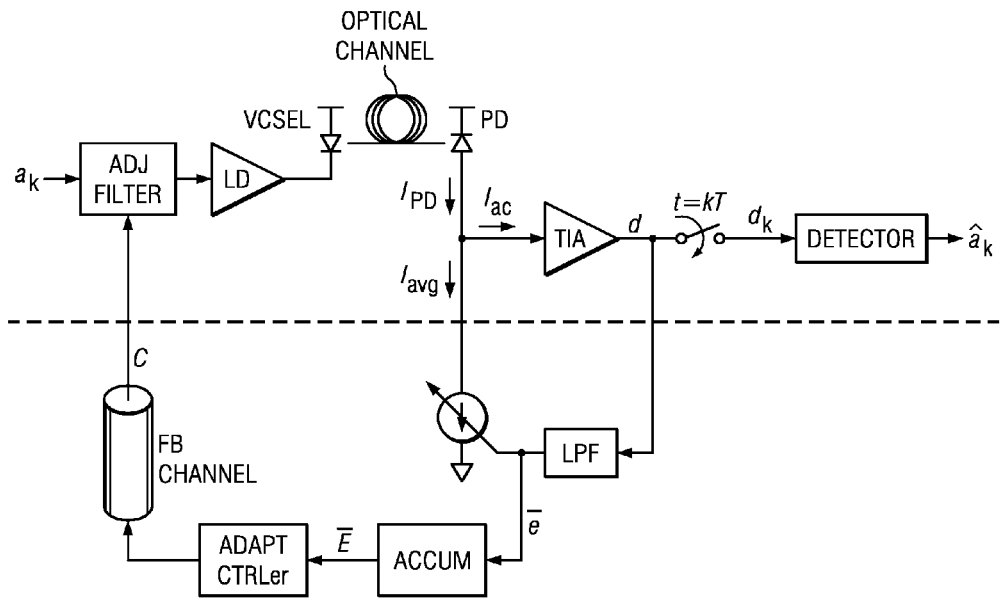
FIG. 7 illustrates an example VCSEL-based optical link with adaptive feedback control.

FIG. 7 illustrates an example VCSEL-based optical link with adaptive feedback control. In particular embodiments, the optical signal produced by the VCSEL may be coupled to the optical channel. The optical channel may further be coupled to a photodiode (PD). In particular embodiments, the PD may receive the optical signal and convert it to an electrical current $I_{PD}$), which may be converted to a voltage d by a transimpedance amplifier (TIA). The voltage d may be sampled via a sampling switch, producing data sequence $d_k$. In particular embodiments, a detector may recover the original transmitted sequence $â_k$. In some embodiments, these operations may be performed at the full channel speed, such as, for example, 25 Gb/s.

In particular embodiments, a low-pass filter (LPF) may be connected to the output of the TIA. The LPF may sense the DC (i.e., average) level of d and may generate an error signal $\bar{e}$ corresponding to d. In particular embodiments, $\bar{e}$ may be used to adjust the magnitude of a current source connected at the PD's anode. By virtue of feedback, $\bar{e}$ may settle to the value that causes the current source to produce the average current $I_{avg}$ generated by the PD. Subtracting $I_{avg}$ from $I_{PD}$ may leave a net current $I_{ac}$ whose average value is zero. In this manner, the feedback loop enclosing the PD and TIA may perform the task of offset compensation for the PD. In particular embodiments, the offset-compensation operation may be performed at a speed substantially below that of the channel speed because of the LPF.

Figure 8:
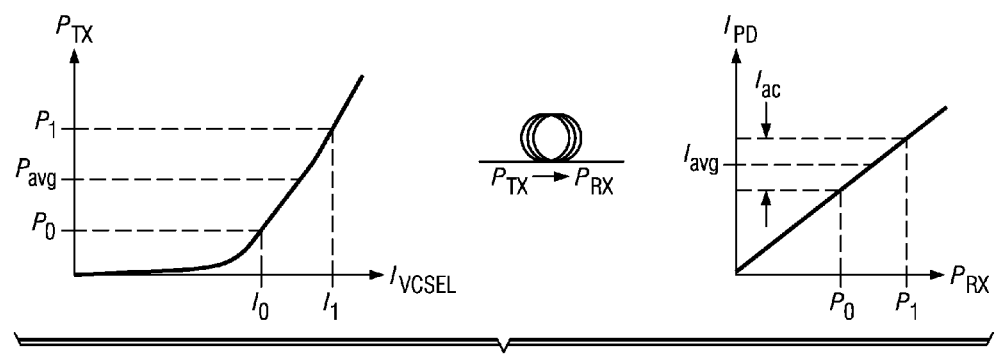
FIG. 8 illustrates example signal levels at the transmitter and receiver in the example VCSEL-based optical link of FIG. 7.

In particular embodiments, the RX may require an offset-compensation mechanism to process $I_{ac}$. Because the VCSEL may be modulated between two positive, non-zero current magnitudes, the VCSEL may produce a positive, non-zero average output power. In a DC-coupled link, the AC signal ($I_{ac}$) may not be sensed and processed with maximum sensitivity if the DC component of the signal ($I_{avg}$) is not removed In particular embodiments, the offset-compensation loop may be further used to compensate the effects of temperature fluctuations or aging on the VCSEL. Specifically, the value to which $\bar{e}$ settles provides a measure of the average signal level generated first by the VCSEL and then, after passing through the signal channel, sensed by the PD at the receiver, as FIG. 8 illustrates. Thus, the offset-compensation loop in the RX can be used to regulate the VCSEL's emitted power by monitoring changes in the value to which $\bar{e}$ settles. FIG. 7 also illustrates this.

In particular embodiments, an accumulator (Accum.) may accumulate $\bar{e}$ and produce vector output $\bar{E}$. An adaptation controller (Adapt. CTRLer) may process $\bar{E}$ and issue instruction vector C for an adjustable filter. In particular embodiments, instruction vector C may be sent to the adjustable filter via the feedback channel. In some embodiments, C may include coefficients for the adjustable filter, or it may include intermediate information from which the coefficients are derived.

In certain embodiments, by detecting error information at the RX (and not just locally at the TX), not only may the VCSEL's operation be regulated but so may that of the entire communication link. As a result, factors aside from just temperature dependence or VCSEL aging may be compensated, thereby maintaining link performance in spite of, for example, channel impairments that may occur, such as misalignment or coupling losses. Additionally, the scheme will respond to changes in the link's operating environment that are a consequence of its being operated within a blade server rack, where line cards (i.e., network elements) may be inserted or removed on the fly.

In particular embodiments, further advantages may result from the error information being derived by simple digital circuits. Because these operations do not require large analog circuits and/or additional optical components, such as, for example, auxiliary PDs, optical power splitters or couplers, etc., the error-detection and error-correction operations do not impose a large area or power penalty on the link. In particular embodiments, the error generation may be performed at a speed significantly below that of the channel speed. As an example and not by way of limitation, the accumulator may operate at a lower speed because it may accumulate multiple values of $\bar{e}$ over time before forming adaptation vector C. As a result, the error-correction circuitry has less of a degradational impact on the speed of the data sequence passing through the channel.

Figure 9:
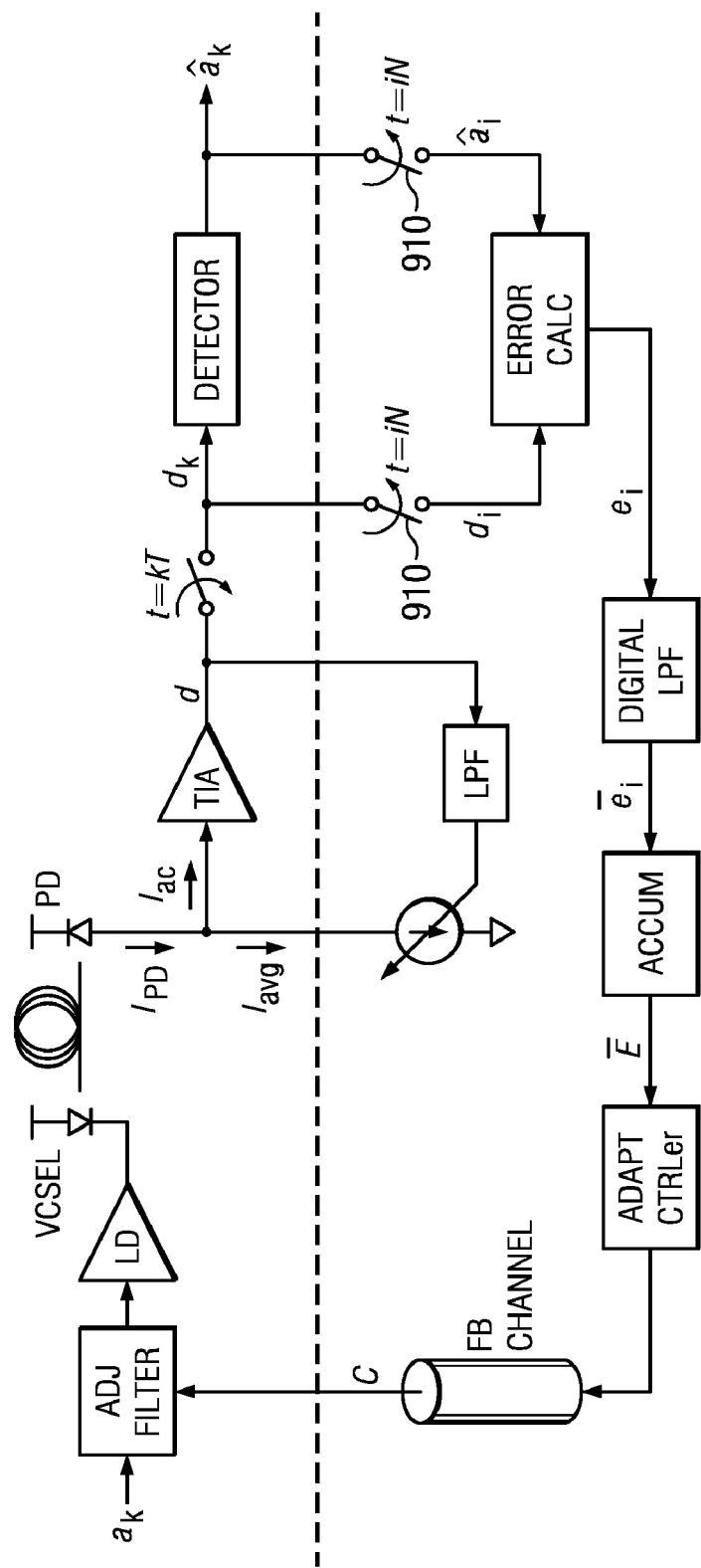
FIG. 9 illustrates another example VCSEL-based optical link with adaptive feedback control.

FIG. 9 illustrates another example VCSEL-based optical link with adaptive feedback control. In particular embodiments, two sub-sampling switches 910 may sample the data sequences $d_k$ and $â_k$, producing sub-sampled data sequences $d_i$ and $â_i$. The sampling rate of these switches is N times slower than the channel speed, such as, for example, 1/16th or lower. An error calculator may determine error information $e_i$ from these two sequences, which may then be filtered by a digital LPF, producing error sequence $\bar{e}_i$. As in FIG. 7, the accumulator may accumulate the error information $\bar{e}_i$ and the adaptation controller may generate instruction vector C. In certain embodiments, the error information may be generated by an error calculator and digital LPF, which may both be digital circuits. This may allow the error-correction scheme to operate with more programmability and flexibility.

Figure 10:
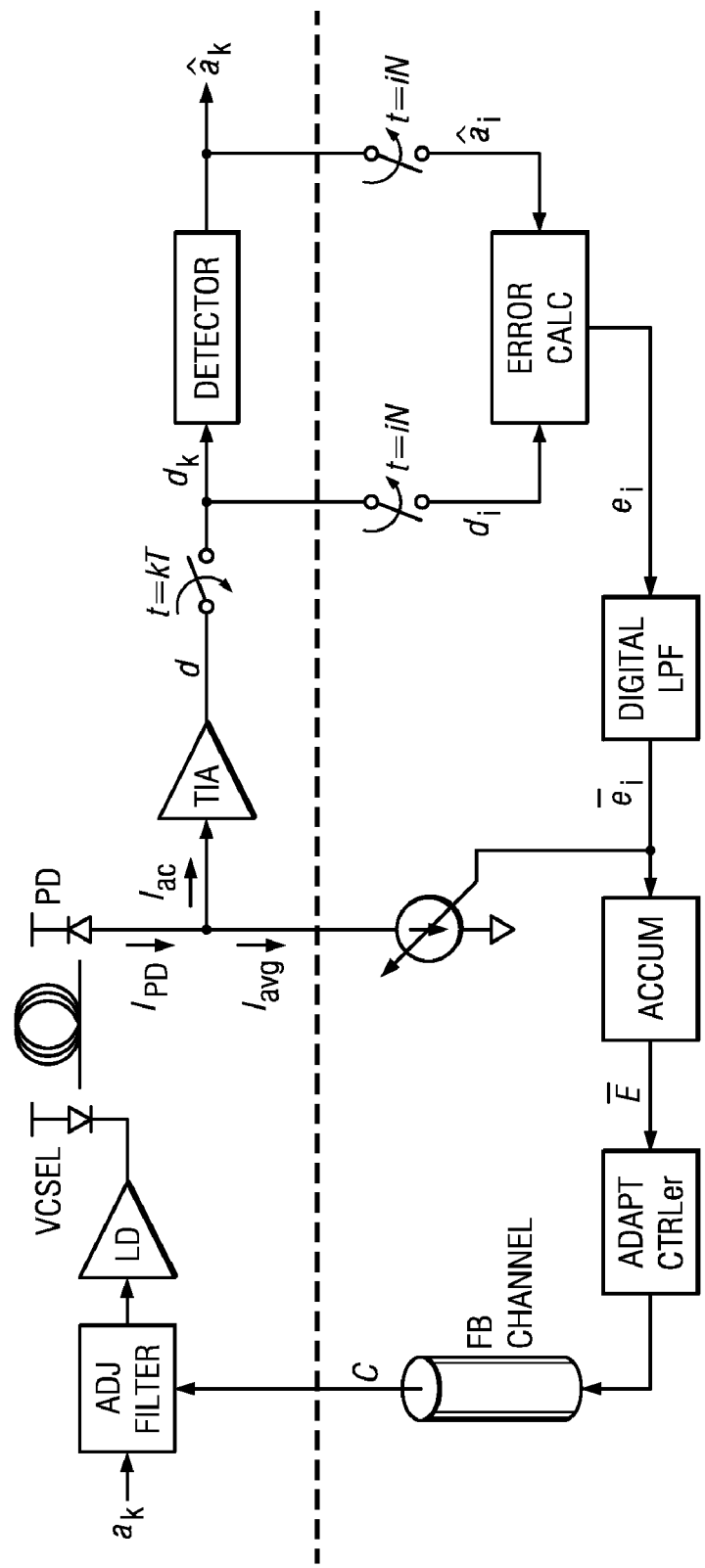
FIG. 10 illustrates another example VCSEL-based optical link with adaptive feedback control.

FIG. 10 illustrates another example VCSEL-based optical link with adaptive feedback control. In particular embodiments, the derived error information $\bar{e}_i$ may control the current source connected to the PD's anode. In certain embodiments, the area and power required are reduced by using $\bar{e}_i$ to control the current source. As a result, one fewer circuit must operate at the full channel speed. In particular embodiments, no circuit that is included only for adaptive control of the VCSEL may operate at the full channel speed. This in turn may improve the efficiency of the network system.

In particular embodiments, all of the VCSEL's optical power may be transmitted to the receiver because degradations in the VCSEL's performance may be sensed at the receiver. As a result, no additional circuits, such as, for example, power splitters, monitor PDs, or holographic lenses may be required in the transmitter to sense the VCSEL's performance, which may lead to less area and power requirements on the transmitter. In certain embodiments, calculating the error information at a rate well below that of the channel speed may reduce the impact on the transmission of the data. Thus, the speed of data transmission may be increased and the communication system may operate more efficiently due to adaptation and regulation of the VCSEL's operation.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
   at a transmitter, biasing a vertical-cavity surface-emitting laser (VCSEL) coupled to an optical medium, the biasing of the VCSEL determining at least in part an optical power output by the VCSEL to the optical medium;
   at the transmitter, modulating the VCSEL with data to transmit the data optically through the optical medium to a receiver operable to recover the modulated data;
   at the transmitter, receiving from the receiver through a feedback channel:
     an error vector representing a degradation in performance of the VCSEL; or
     an instruction vector comprising one or more coefficients for use in biasing the VCSEL, the coefficients having been derived from the error vector; and
   at the transmitter, adjusting the biasing of the VCSEL based on the error vector or the instruction vector to regulate the optical power output by the VCSEL to the optical medium.

2. The method of claim 1, wherein the optical medium is a short-reach optical link.

3. The method of claim 1, wherein the optical medium comprises an optical fiber or a waveguide.

4. The method of claim 1, further comprising deriving at the transmitter the instruction vector from the error vector.

5. The method of claim 1, wherein the feedback channel is optical, electrical, or logical.

6. The method of claim 1, wherein the feedback channel is physically separate from the optical medium.

7. The method of claim 1, wherein the optical medium carries the feedback channel.

8. The method of claim 1, wherein the error vector comprises amplitude or bias-level error information.

9. The method of claim 1, wherein the optical power output by the VCSEL to the optical medium is regulated to have a substantially constant average.

10. The method of claim 1, wherein the error vector represents a degradation in performance of the VCSEL sensed by a low-pass filter at the receiver.

11. The method of claim 1, wherein the error vector represents a degradation in performance of the VCSEL sensed by an error calculator at the receiver, the error calculator comparing the power output of the VCSEL received at the receiver and the digital output of the receiver.

12. A method comprising:
   at a receiver, receiving data transmitted by a vertical-cavity surface-emitting laser (VCSEL) at a transmitter optically through an optical medium;
   at the receiver, recovering the received data;
   at the receiver, sensing a degradation in performance of the VCSEL;
   at the receiver, generating:
     an error vector representing the degradation in performance of the VCSEL; or
     an instruction vector comprising one or more coefficients for use in biasing the VCSEL at the transmitter, the biasing of the VCSEL at the transmitter determining at least in part an optical power output by the VCSEL to the optical medium; and
   at the receiver, transmitting the error vector or the instruction vector through a feedback channel to the transmitter for adjustment of the biasing of the VCSEL based on the error vector or the instruction vector to regulate the optical power output by the VCSEL to the optical medium.

13. The method of claim 12, wherein the optical medium is a short-reach optical link.

14. The method of claim 12, wherein the optical medium comprises an optical fiber or waveguide.

15. The method of claim 12, wherein the instruction vector is derived at the transmitter from the error vector.

16. The method of claim 12, wherein the feedback channel is optical, electrical, or logical.

17. The method of claim 12, wherein the feedback channel is physically separate from the optical medium.

18. The method of claim 12, wherein the optical medium carries the feedback channel.

19. The method of claim 12, wherein the error vector comprises amplitude or bias-level error information.

20. The method of claim 12, wherein the optical power output by the VCSEL to the optical medium is regulated to have a substantially constant average.

21. The method of claim 12, wherein the degradation in performance of the VCSEL is detected by a low-pass filter at the receiver.

22. The method of claim 12, wherein the degradation in performance of the VCSEL is detected by an error calculator at the receiver, the error calculator comparing the power output of the VCSEL received at the receiver and the digital output of the receiver.

23. A transmitter configured to:
 bias a vertical-cavity surface-emitting laser (VCSEL) coupled to an optical medium, the biasing of the VCSEL determining at least in part an optical power output by the VCSEL to the optical medium;
 modulate the VCSEL with data to transmit the data optically through the optical medium to a receiver operable to recover the modulated data;
 receive from the receiver through a feedback channel:
  an error vector representing a degradation in performance of the VCSEL; or
  an instruction vector comprising one or more coefficients for use in biasing the VCSEL, the coefficients having been derived from the error vector; and
 adjust the biasing of the VCSEL based on the error vector or the instruction vector to regulate the optical power output by the VCSEL to the optical medium.

24. The transmitter of claim 23, wherein the optical medium is a short-reach optical link.

25. The transmitter of claim 23, wherein the optical medium comprises an optical fiber or a waveguide.

26. The transmitter of claim 23, further configured to derive the instruction vector from the error vector.

27. The transmitter of claim 23, wherein the feedback channel is optical, electrical, or logical.

28. The transmitter of claim 23, wherein the feedback channel is physically separate from the optical medium.

29. The transmitter of claim 23, wherein the optical medium carries the feedback channel.

30. The transmitter of claim 23, wherein the error vector comprises amplitude or bias-level error information.

31. The transmitter of claim 23, wherein the optical power output by the VCSEL to the optical medium is regulated to have a substantially constant average.

32. The transmitter of claim 23, wherein the error vector represents a degradation in performance of the VCSEL sensed by a low-pass filter at the receiver.

33. The transmitter of claim 23, wherein the error vector represents a degradation in performance of the VCSEL sensed by an error calculator at the receiver, the error calculator comparing the power output of the VCSEL received at the receiver and the digital output of the receiver.

34. A receiver configured to:
 receive data transmitted by a vertical-cavity surface-emitting laser (VCSEL) at a transmitter optically through an optical medium;
 recover the received data;
 sense a degradation in performance of the VCSEL;
 generate:
  an error vector representing the degradation in performance of the VCSEL; or
  an instruction vector comprising one or more coefficients for use in biasing the VCSEL at the transmitter, the biasing of the VCSEL at the transmitter determining at least in part an optical power output by the VCSEL to the optical medium; and
 transmit the error vector or the instruction vector through a feedback channel to the transmitter for adjustment of the biasing of the VCSEL based on the error vector or the instruction vector to regulate the optical power output by the VCSEL to the optical medium.

35. The receiver of claim 34, wherein the optical medium is a short-reach optical link.

36. The receiver of claim 34, wherein the optical medium comprises an optical fiber or waveguide.

37. The receiver of claim 34, wherein the instruction vector is derived at the transmitter from the error vector.

38. The receiver of claim 34, wherein the feedback channel is optical, electrical, or logical.

39. The receiver of claim 34, wherein the feedback channel is physically separate from the optical medium.

40. The receiver of claim 34, wherein the optical medium carries the feedback channel.

41. The receiver of claim 34, wherein the error vector comprises amplitude or bias-level error information.

42. The receiver of claim 34, wherein the optical power output by the VCSEL to the optical medium is regulated to have a substantially constant average.

43. The receiver of claim 34, wherein the degradation in performance of the VCSEL is detected by a low-pass filter at the receiver.

44. The receiver of claim 34, wherein the degradation in performance of the VCSEL is detected by an error calculator at the receiver, the error calculator comparing the power output of the VCSEL received at the receiver and the digital output of the receiver.

\* \* \* \* \*